United States Patent [19]

Sprague

[11] Patent Number: 4,617,645

[45] Date of Patent: Oct. 14, 1986

[54] COMPACTION METHOD FOR WAVEFORM STORAGE

[75] Inventor: Richard P. Sprague, Westminster, Calif.

[73] Assignee: First Byte, Long Beach, Calif.

[21] Appl. No.: 649,227

[22] Filed: Sep. 10, 1984

[51] Int. Cl.$^4$ .................... G11C 13/00; G11C 27/00
[52] U.S. Cl. .................................. 365/45; 307/490
[58] Field of Search .................... 365/45, 189; 307/229

[56] References Cited

U.S. PATENT DOCUMENTS 3,537,077  10/1970  Gerig .................................. 365/45

Primary Examiner—Terrell W. Fears
Attorney, Agent, or Firm—Weissenberger & Peterson

[57] ABSTRACT

The memory needed for the digital storage of a waveform having an amplitude range of ±128 units is compacted by nearly 50% through the use of a 16-position table containing selected increments. Each waveform sample value is first predicted from at least two prior samples by linear prediction, and the predicted value is then incremented by the most nearly accurate increment in the table to obtain an approximation of the actual waveform value at the sample point. The appropriate increment for each sample can be defined by a 4-bit table address. The best-fit increment values for any given waveform can be calculated by a reiterative trial-and-error computation process. By the use of a best-fit table, inaccuracies in the waveform reproduction can be held below audible levels.

10 Claims, 4 Drawing Figures

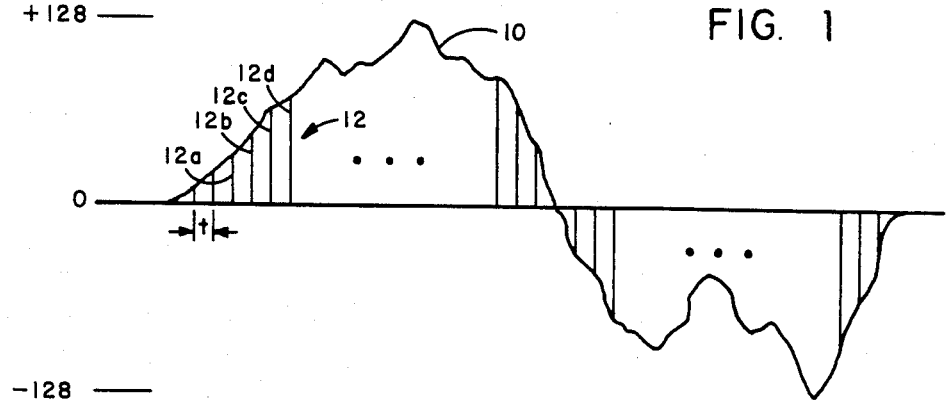
FIG. 1
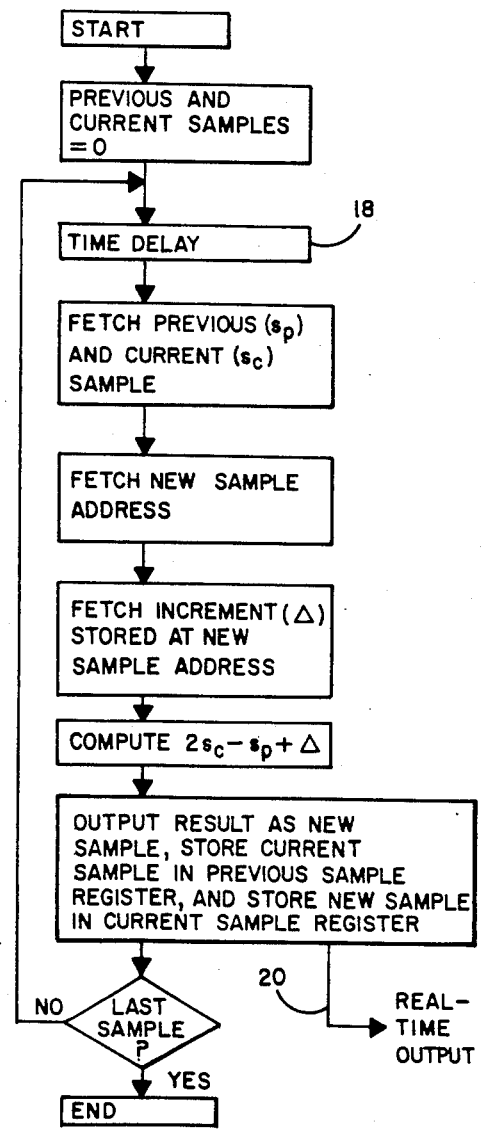
FIG. 2
FIG. 3

COMPACTION METHOD FOR WAVEFORM STORAGE

This invention relates to a compaction method for the digital storage of waveforms, and more particularly to a method using a modified linear prediction technique for achieving a nearly fifty percent compaction of digital waveform information.

BACKGROUND OF THE INVENTION

In several communication fields such as, for example, the digital speech storage field, it is desirable to store a large number of complex waveforms in a digital format. Typically, waveforms of this nature are stored by storing the digitized amplitude values of successive samples of the waveform in accordance with well-known pulse code modulation (PCM) techniques.

A disadvantage of this type of digital storage is that each sample usually requires a minimum of 8 bits of memory space. Inasmuch as the storage of a large number of waveforms thus consumes an appreciable amount of memory, it is highly desirable for microcomputer applications to reduce these memory requirements by some form of compaction of the sample information.

Various methods for achieving this compaction, such as delta pulse code modulation (DPCM) have been proposed, but these methods save at best one or two bits per sample.

SUMMARY OF THE INVENTION

The method of the present invention results in a considerable compaction of digitized waveform information, to the point where each sample can be evaluated within close tolerances by the use of a single 4-bit nibble address. Specifically, a 16-position table is provided for each waveform. Each position within this table contains a positive or negative increment to be applied to a value computed from previous samples.

The waveform is analyzed using a reiterative trial-and-error method to determine the best-fit values for the increments in the table; i.e. the increment values are so determined as to produce the smallest total power deviation from the actual waveform when successive sample values are formed by incrementing a linear combination of previous samples by the best available increment.

It is therefore the object of the invention to save memory space for the storage of digitized waveform samples by approximating the waveform as closely as possible at each sample point through the incrementing of a linear combination of previous samples by one of a relatively small number of predetermined increments.

BRIEF DESCRIPTION OF THE DRAWINGS

FIG. 1 is a time-amplitude diagram illustrating the sampling of a complex waveform;

FIG. 2 is a diagram representing a typical increment table;

FIG. 3 is a flow chart illustrating the computation of successive samples in accordance with this invention.

DESCRIPTION OF THE PREFERRED EMBODIMENT

Figure 4:
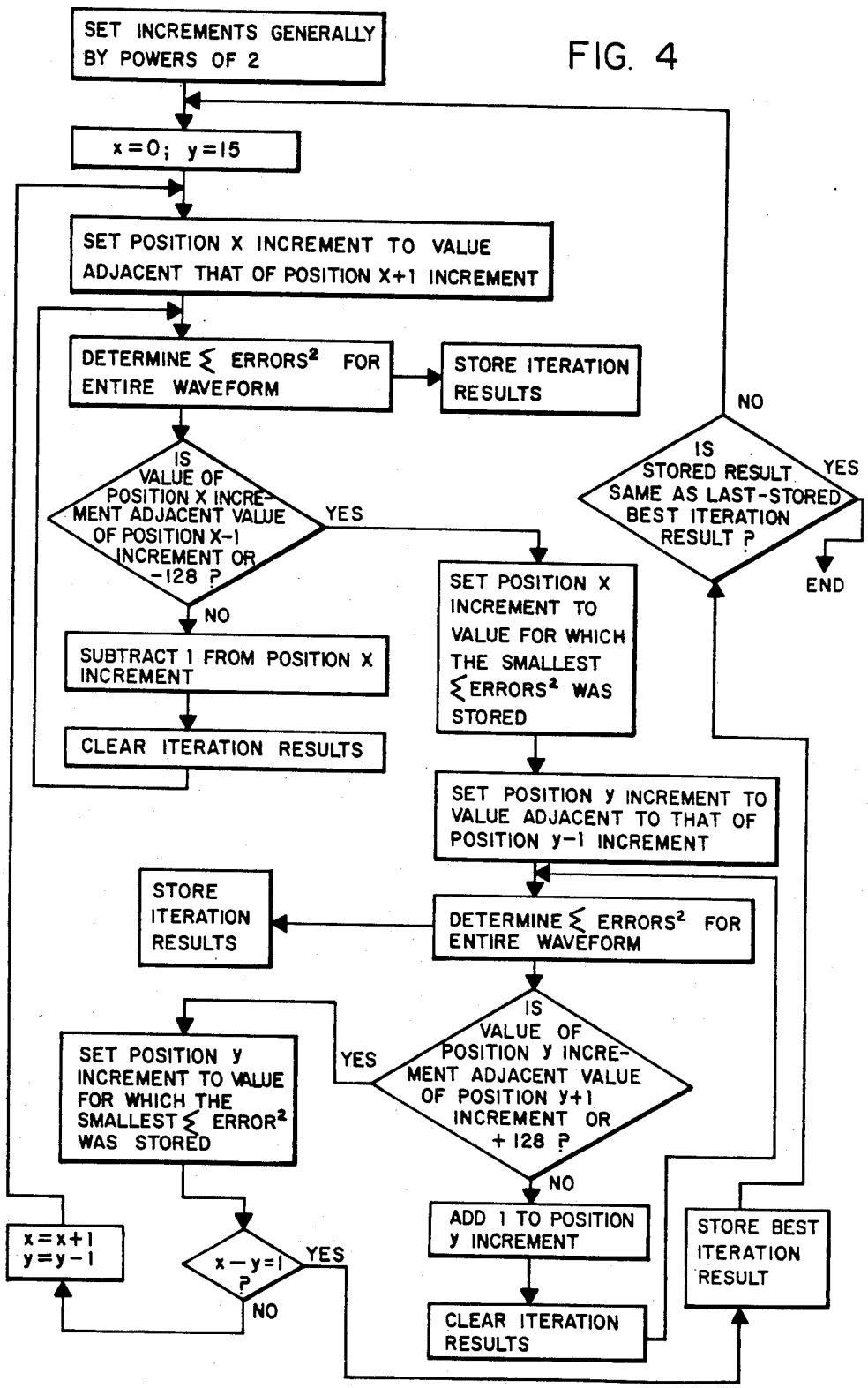
FIG. 4 is a flow chart illustrating the process of producing the increment tables of this invention.

FIG. 1 shows a waveform which is to be stored in digital form. The maximum amplitude of the waveform 10 is ±128 amplitude units. In accordance with conventional PCM techniques, the waveform 10 can be accurately defined by equidistant amplitude samples 12 taken at intervals t along the entire wave.

If the samples 12 were to be stored directly, their total amplitude range would cover 256 amplitude units, and would require eight bits for storage. In accordance with the invention, however, the samples 12 are not stored independently, but rather each sample 12 is derived from the preceding ones by a 4-bit address in accordance with the method described below.

In accordance with the invention, a 16-byte table 14 (FIG. 2) is provided for each waveform 10 within the memory of the storage device. The sixteen bytes of the table 14 are addressable by a 4-bit address and contain the values of sixteen different predetermined increments. In the preferred embodiment, each sample 12 is computed by predicting its value from a linear combination of the current and next previous samples and then incrementing the predicted value by one of the increments in table 14. For example, if the amplitude of the sample 12a is ±5 and the amplitude of sample 12b is +9, the predicted value of sample 12c might be computed at $(2x+9)-(+5)=+13$. If the actual amplitude of waveform 10 at 12c is, say, +16, then the ideal increment to be added to the predicted value of 12c would +3. However, inasmuch as the nearest increment in table 14 is +2, sample 12c would be computed at +15, which produces an error of −1. Likewise, the predicted value of sample 12d would be $(2x+15)-(+9)=+21$. If the actual amplitude of waveform 10 at 12d is 30 (i.e. an ideal increment of +9), and the nearest actual increment in table 14 is +11, sample 12d would be computed as +32 and would produce an error of +2.

The use of any increments which would cause a sample 12 to exceed ±128 amplitude units results in samples of +128 or −128, as the case may be, as that is the limit of the sample registers' capacity. Alternatively, in such instances, a neighboring increment may be chosen which avoids arithmetic overflow (exceeding ±128). This permits the algorithm which reconstructs the waveform to be simplified by not having to check for overflow. The cost of this simpler algorithm is a slight increase in the average error in the resultant waveform.

It will be seen that the computed samples will frequently be a little greater or a little less than the actual amplitude of the gave 10 at the sample point. If these errors remain small enough, the power error (i.e. the sum of the squares of the amplitude errors) in reconstituting the wave 10 will be small (on the order of 5% at the most) and the sound produced by reconstituting the wave 10 will not be noticeably affected.

It will be clear from the foregoing discussion that it is imperative to keep the sum of the squares of the sample errors as small as possible. This can be accomplished by computing, for each waveform 10, a best-fit table containing a set of sixteen increments which will produce the least possible errors for that particular waveform. Inasmuch as this set of increments is different for each waveform, a separate table 14 is required for each wave 10 to be reproduced. Because the tables 14 require some memory (although, in the context of the total system, very little) the compaction realized by the method of this invention is not exactly 50% but is slightly less. Nevertheless, the method of this invention is far superior to the compaction methods used heretofore and produces results which, for the human ear, are essentially indistinguishable from the sounds produced by individual sample storage.

FIG. 3 illustrates the construction of each sample, by linear prediction and incrementation, from the two preceding samples. It will be noted that the only data which needs to be permanently stored in memory individually for each sample is the four-bit address on the left side of table 14 which corresponds to the increment to be used for that sample. With that data, each new sample $S_n$ is readily derived from the current sample $S_c$ and the next previous sample $S_p$ by computing $$S_n = 2S_c - S_p + \Delta$$

where $\Delta$ is the addressed increment in table 14.

A time delay 18 may need to be incorporated in the program loop of FIG. 2 so that the output 20 will occur at time intervals t (FIG. 1). In this manner, the waveform 10 is reproduced as a real-time sound.

In accordance with the preferred embodiment of the invention, as illustrated in FIG. 4, the computation of the best-fit table for any given waveform is begun by assigning the following increment values to the sixteen positions of the table 14: −64, −48, −32, −16, −8, −4, −2, −1, 0, +1, +2, +4, +8, +16, +32, +64. A computation of the samples 12 for the entire waveform 10 is then run, as described above, reiteratively with various values of the first increment ranging from −49 to −128. For each iteration, the sum of the squares of the errors is computed, and the first increment is then fixed at whatever value produces the least sum of the squares.

The reiterative computation is next repeated while varying the last increment from +33 to +128. With the first and last increments thus fixed, the reiterative computation is resumed, varying the second increment between −33 and the value next to that at which the first increment has previously been fixed. Similarly, the computation is then re-run with the next to the last increment, the third increment, and so on until all increments have been fixed.

The sum of the squares of the errors resulting from the most favorable iteration of the last computation of this procedure is now recorded, and the entire procedure is performed a second time. If the sum of the squares of the errors resulting from the most favorable iteration of the last computation of the second performance of the procedure is smaller than that of the first performance, the procedure is performed a third time; and so on until two successive performances of the procedure produce no change in the sum of the square of the errors. Without having exhaustively searched all $$\frac{128!}{16!(128-16)!} = \frac{128 \times 127 \times \ldots \times 113}{16 \times 15 \times 14 \times \ldots \times 1}$$

possible assignments for the best-fit table, this method produces a set of increments which is very close to, if not actually, optimal.

It will be seen that the method described herein allows a substantial compaction of waveform data and thus makes possible the use of sophisticated artificial speech programs on relatively low-power microcomputers.

What is claimed:

1. A method of compactly storing and retrieving a waveform, comprising the steps of:
    (a) establishing a table containing a relatively small number of predetermined increments;
    (b) storing a series of addresses, each address identifying one of said increments in said table;
    (c) successively producing a series of samples representing generally the value of said waveform at time-spaced intervals, each of said samples corresponding to one of said addresses;
    (d) predicting the value of each new sample to be produced, said predicted value being a fixed function of the values of at least a current and a previous sample;
    (e) incrementing said predicted value by the increment identified by said address for said new sample, to produce a sample value at least approximating the actual value of said waveform at the sampling point; and
    (f) reconstituting said waveform from said approximating samples.

2. The method of claim 1, further comprising the step of minimizing the approximation errors between said sample values and said actual waveform values.

3. The method of claim 2, in which said minimizing step includes the steps of:
    (i) assigning generally arbitrary values to said increments;
    (ii) reiteratively computing a predetermined function of said approximation errors using various values for one of said increments;
    (iii) fixing said one increment at the value for which said error function is a minimum; and
    (iv) repeating said computing and fixing steps for each of the remaining increments in said table.

4. The method of claim 3, further comprising the step of re-performing steps (ii) through (iv) until said minimum error function for the last of said increments is identical in two consecutive performances.

5. The method of claim 3, in which said increments are varied between the values of their next adjacent increments for the purposes of said reiterative computations.

6. The method of claim 3, in which said reiterative computations are made for the various increments in descending order of their absolute magnitude.

7. The method of claim 3, in which said error function is the sum of the squares of the approximation errors of all of said samples.

8. The method of claim 1, in which said relatively small number is the square root of the number of possible values said samples can have.

9. The method of claim 1, in which said new sample value is predicted by a linear combination.

10. The method of claim 9, in which said fixed function is $2S_c - S_p$, where $S_c$ is the current sample and $S_p$ the next previous sample.

* * * * *